US006968521B2

(12) United States Patent
Ushiyama et al.

(10) Patent No.: US 6,968,521 B2
(45) Date of Patent: Nov. 22, 2005

(54) METHOD, APPARATUS AND PROGRAM PRODUCT FOR AUTOMATIC PLACEMENT AND ROUTING OF INTEGRATED CIRCUIT

(75) Inventors: Kenichi Ushiyama, Kawasaki (JP); Shigenori Ichinose, Kawasaki (JP); Kouji Banno, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 144 days.

(21) Appl. No.: 10/331,513

(22) Filed: Dec. 31, 2002

(65) Prior Publication Data

US 2003/0182648 A1   Sep. 25, 2003

(30) Foreign Application Priority Data

Mar. 20, 2002   (JP) .............................. 2002-079086

(51) Int. Cl.[7] .......................................... G06F 17/50
(52) U.S. Cl. .................. 716/5; 716/9; 716/10; 716/13; 716/14
(58) Field of Search ............................ 716/5, 9, 10, 13, 716/14

(56) References Cited

U.S. PATENT DOCUMENTS

| | | | | |
|---|---|---|---|---|
| 3,621,208 A | * | 11/1971 | Isett et al. ...................... | 716/12 |
| 5,822,214 A | * | 10/1998 | Rostoker et al. ............... | 716/10 |
| 5,883,812 A | * | 3/1999 | Fujii ............................. | 716/10 |
| 6,202,194 B1 | * | 3/2001 | Seningen et al. .............. | 716/10 |
| 6,317,864 B1 | * | 11/2001 | Kikuchi et al. ................ | 716/11 |
| 6,353,917 B1 | * | 3/2002 | Muddu et al. .................. | 716/6 |
| 6,405,350 B1 | * | 6/2002 | Tawada .......................... | 716/5 |
| 6,507,935 B1 | * | 1/2003 | Aingaran et al. ............... | 716/5 |
| 6,530,066 B1 | * | 3/2003 | Ito et al. ......................... | 716/5 |
| 6,532,583 B1 | * | 3/2003 | Shibuya ........................ | 716/13 |
| 6,553,338 B1 | * | 4/2003 | Buch et al. .................... | 703/14 |
| 6,594,805 B1 | * | 7/2003 | Tetelbaum et al. ............. | 716/5 |
| 6,601,222 B1 | * | 7/2003 | Mehrotra et al. ............... | 716/5 |

(Continued)

FOREIGN PATENT DOCUMENTS

JP   5-243383   9/1993   ........... H01L 21/82

(Continued)

OTHER PUBLICATIONS

Lai et al., "A quadratic programming method for interconnection crosstalk minimization", Proceedings of the 1999 IEEE International Symposium on Circuits and Systems, vol. 6, May 30, 1999, pp. 270-273.*

(Continued)

*Primary Examiner*—Matthew Smith
*Assistant Examiner*—Phallaka Kik
(74) *Attorney, Agent, or Firm*—Staas & Halsey LLP

(57) ABSTRACT

After automatic cell placement, the following steps are performed before performing automatic inter-cell routing. (S22) Estimated wires having Manhattan-length path are connected between same-node terminals of cells, and detected and counted is a crosstalk error that parallel-wire length is more than a predetermined value. (S23) The detected error is resolved by moving cells closely spaced less than a predetermined interval apart and connected to the error-detected estimated wires; the cell movement data is stored in a storage device; and such processes are repeated N times; and the cell placement data is modified on the basis of the cell movement data corresponding to the minimum value of error-count values of all the N times. (S24) If the minimum value is not 0, (S25) a buffer cell is inserted in the error-detected estimated wire. (S27) Obtained is the wire density of estimated wiring having Manhattan-length path, and if the density is more than a predetermined value, the design-target frame is enlarged in size, and the process returns to the automatic cell placement process.

19 Claims, 10 Drawing Sheets

U.S. PATENT DOCUMENTS

| | | | |
|---|---|---|---|
| 6,615,395 B1 * | 9/2003 | Hathaway et al. | 716/6 |
| 6,732,340 B1 * | 5/2004 | Akashi | 716/5 |
| 6,772,406 B1 * | 8/2004 | Trimberger | 716/12 |
| 6,810,512 B2 * | 10/2004 | Roohparvar | 716/13 |
| 6,834,380 B2 * | 12/2004 | Khazei | 716/10 |
| 6,858,935 B1 * | 2/2005 | Teig et al. | 257/758 |
| 6,907,590 B1 * | 6/2005 | Al-Dabagh et al. | 716/6 |
| 2002/0004929 A1 * | 1/2002 | Osaki et al. | 716/10 |
| 2002/0046389 A1 * | 4/2002 | Hirakimoto et al. | 716/8 |
| 2002/0078425 A1 * | 6/2002 | Mehrotra et al. | 716/6 |
| 2003/0009727 A1 * | 1/2003 | Takeyama et al. | 716/1 |
| 2004/0088664 A1 * | 5/2004 | Srinivasan | 716/6 |

FOREIGN PATENT DOCUMENTS

| | | | | |
|---|---|---|---|---|
| JP | 7-249065 | | 9/1995 | G06F 17/50 |
| JP | 9-269958 | | 10/1997 | G06F 17/50 |
| JP | 2000082089 A | * | 3/2000 | G06F 17/50 |
| JP | 2001-267427 | | 9/2001 | H01L 21/82 |

OTHER PUBLICATIONS

Tien et al., "Crosstalk alleviation for dymanic PLAs", 2002 Proceedings of Design, Automation and Test in Europe Conference and Exhibition, Mar. 4, 2002, pp. 683-687.*

Voelker, "Transposing conductors in signals buses to reduce nearest-neighbor crosstalk", IEEE Transactions on Microwave Theory and Techniques, vol. 43, No. 5, pp. 1095-1099.*

Seki et al., "Analysis of crosstalk in very high-speed LSI/VLSI's using a coupled multiconductor MIS microstrip line model", IEE Transactions on Microwave Theory and Techniques, vol. 32, No. 12, pp. 1715-1720.*

NA8406399, "Wire Routing With Path History Depedent Penalty Functions", IBM Technical Disclosure Bulletin, vol. 27, No. 1A Jun. 1984, pp. 399-406 (10 pages).*

NA82045666, "Global Wiring with minimum Rectangles", IBM Technical Disclosure Bulletin, vol. 24, No. 11A, Apr. 1982, pp. 5666-5668 (5 pages).*

NN9310447, "Optimal Net Ordering for via Noise Minimization in TCM Design", IBM Technical Disclosure Bulletin, vol. 36, No. 10, Oct. 1993, pp. 447-450 (8 pages).*

NN8407978, "Wire Routing Subject to Constraints", IBM Technical Disclosure Bulletin, vol. 27, No. 2, Jul. 1984, pp. 978-982 (pages).*

* cited by examiner

METHOD, APPARATUS AND PROGRAM PRODUCT FOR AUTOMATIC PLACEMENT AND ROUTING OF INTEGRATED CIRCUIT

CROSS-REFERENCE TO RELATED APPLICATIONS

This application is based upon and claims the benefit of priority from the prior Japanese Patent Application No. 2002-079086, filed on Mar. 20, 2002, the entire contents of which are incorporated herein by reference.

BACKGROUND OF THE INVENTION

1. Field of the Invention

The present invention relates to a method, apparatus, and program product for an automatic cell placement and wire routing between cells in designing the layout of integrated circuit.

2. Description of the Related Art

Coupling capacitance and coupling inductance between signal lines cause mutual interference (crosstalk), with a result that the signal waveforms are deformed to generate false signals. Miniaturization in elements of LSI makes easier the occurrence of crosstalk and leads to increase in time to correct a layout in an automatic cell placement and wire routing between cells.

FIGS. 9 and 10 are flowcharts showing a prior art an automatic cell placement and wire routing between cells process.

(S1) Cells are automatically placed in a frame on the basis of data of a net-list and a cell library so as to obtain an optimum value of an evaluation function.

(S2) Automatic routing between cells is performed on the basis of data of the net-list and the cell library.

(S3) Determined are resistance and capacitance values of laid-out wiring.

(S4) A check is made for each signal input of each cell as to whether signal is dulled due to resistance and capacitance of wiring connected to the signal input and the input/output capacitance of the cell, that is, as to whether there is a slew rate error that slew rate of the input signal is lower than a predetermined value.

(S5) If there is one judged to be a slew rate error, then the process goes to step S8, or else, goes to step S6.

(S6) A static timing analysis (STA) is performed for each flip flop.

(S7) If a timing error is detected in this STA, then the process goes to step S8, or else, goes to step S9.

(S8) A buffer cell is inserted in each line connected to a signal input of a cell in which the error is detected. Here, when there is no sufficient space to insert the buffer cell, its neighboring cells or lines are moved to secure a space. The process returns to step S3 to perform again an error check for each portion affected by insertion of a buffer cell or movement of cells or lines.

(S9) A check is made as to whether there is a parallel-wire length error (crosstalk error) that the wire length of parallel lines which are spaced less than a predetermined interval from each other is more than a predetermined value.

(S10) If this crosstalk error exists, then the process goes to step S13, or else, goes to step S11.

(S11) Taking into consideration the delay of signal propagation caused by coupling of capacitance and inductance between the lines in parallel, the STA is performed for each flip flop connected to one end or both ends of the lines in parallel.

(S12) If a timing error is detected in this STA, then the process goes to step S13, or else the process is completed.

(S13) A buffer cell(s) is inserted in each of the lines in parallel connected to the error-detected cell, or the interval between the lines in parallel is widened (spacing is performed). Here, when there is no sufficient space to insert the buffer cell, its neighboring cells or wiring is moved to secure the space.

(S14) Calculation is made for obtaining resistance and capacitance values of wiring that are changed in layout in step S13. The process returns to step S9 so as to perform again checks of steps S9 and S11 for portions in which the error is detected and which are affected by the error.

However, for example, if one of the lines in parallel is moved in order to resolve the crosstalk error, a new crosstalk may occur between the moved line and its neighboring one, and therefore, the processes of steps S9 to S14 of FIG. 10 are repeated several times in general, causing a problem of increasing turn around time of development (turn around time).

In addition, there is a need to determine the frame size of chip in advance with taking into consideration of the increase of layout space due to the spacing between the lines in parallel or insertion of buffer cells. This leads to occurrence of useless regions, tending to increase in chip size more than necessary.

Similarly, such problems occur also in connection with a self-wire length error.

SUMMARY OF THE INVENTION

Accordingly, it is an object of the present invention to provide a method, apparatus, and program product for an automatic cell placement and wire routing between cells which can reduce a time needed to cope with crosstalk errors so as to allow reduction in turn around time of development.

Another object of the present invention is to provide a method, apparatus, and program product for an automatic cell placement and wire routing between cells which can reduce a time needed to cope with self-wire length errors so as to allow reduction in turn around time of development.

In a first aspect of the present invention, there is provided a method of an automatic cell placement and wire routing between cells, wherein cell placement data have been obtained by performing an automatic cell placement, and before an automatic wire routing between cells, the method comprising the steps of:

(a) connecting estimated wires of Manhattan-length path between same node terminals of cells, and detecting a crosstalk error that a parallel-wire length is more than a predetermined value; and (b) resolving a detected crosstalk error by moving at least one of cells closely spaced less than a predetermined interval from each other and connected to ones of the estimated wires where the crosstalk error is detected.

Because the preparation of steps (a) and (b) is performed before the automatic routing, it can be performed easily and quickly. The preparation can reduce crosstalk errors to be introduced by an automatic routing, and therefore a time of the overall process of the automatic placement and routing can be reduced, consequently allowing reduction in turn around time of development.

In addition, this preparation makes it possible to decrease the area of a design-target frame where a margin is secured for spacing or insertion of buffer cells to cope with errors after wire routing, reducing useless regions.

In a second aspect of the present invention, the detected crosstalk error is counted in the step (a); cell movement data is stored in a storage device in the step (b); a set of the steps (a) and (b) is repeated a plurality of times; and the method further comprises the step of:

(c) modifying the cell placement data on the basis of the cell movement data of the step (b) belonging to a set of the steps (a) and (b) corresponding to a minimum value of error counts of all repeated times.

Although there is a possibility that the cell movement causes a new crosstalk error, this method makes it possible to resolve much more crosstalk errors in the preparation.

In a third aspect of the present invention, the method further comprises the step of:

(d) modifying a net list and the cell placement data so as to insert a buffer cell in the error-detected estimated wire when the minimum value is not equal to zero.

There is also a possibility that the cell movement causes a new crosstalk error. However, because the insertion of the buffer cell allows reduction in the number of errors with almost no occurrence of a new error, this method allows reduction in the number of errors efficiently without excessive insertion of buffer cells.

In a fourth aspect of the present invention, the method further comprises the step of:

(e) determining a wire density of the estimated wires of Manhattan-length path between cells, and if the wire density is more than a predetermined value, enlarging a design-target frame, and returning to the automatic cell placement process.

This method allows securing a preparatory region suitable for coping with errors to be introduced after the preparation.

Other aspects, objects, and the advantages of the present invention will become apparent from the following detailed description taken in connection with the accompanying drawings.

DESCRIPTION OF THE PREFERRED EMBODIMENT

Figure 1:
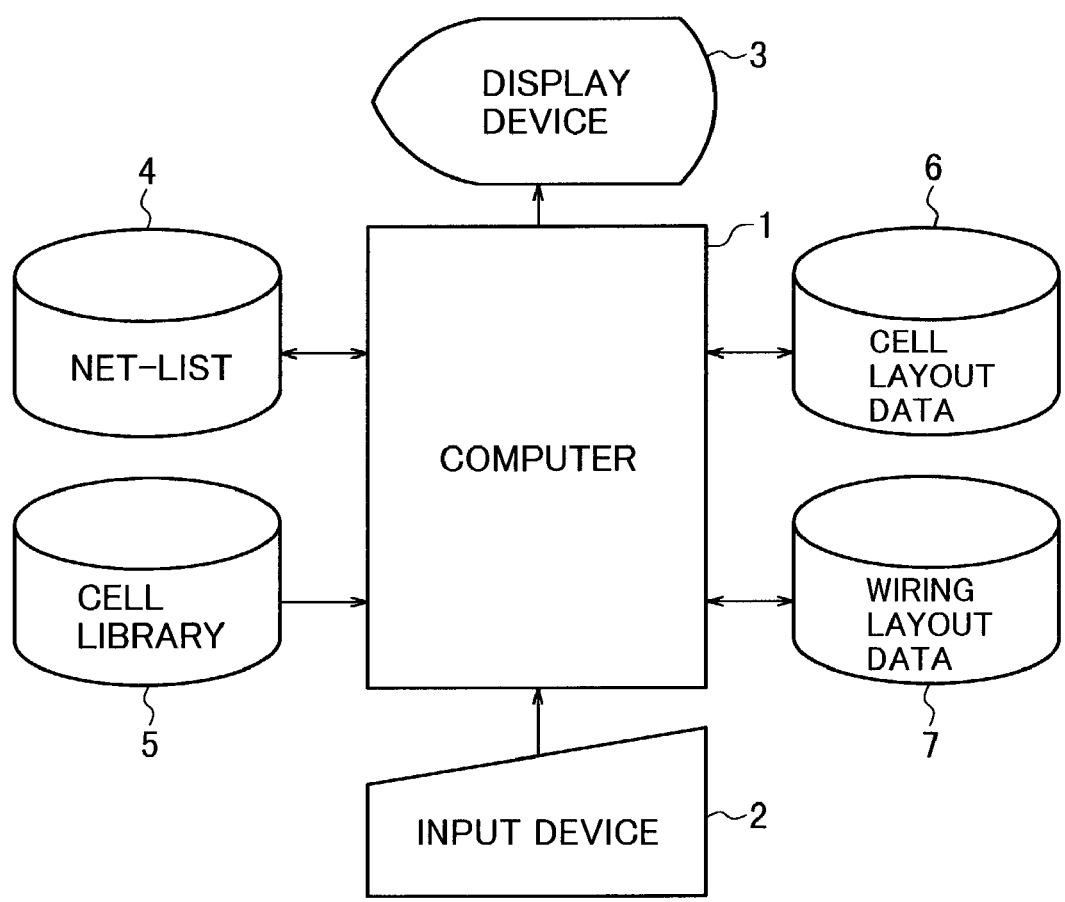
FIG. 1 is a schematic block diagram showing a hardware construction of an automatic cell placement and wire routing between cells apparatus according to one embodiment of the present invention.

Referring now to the drawings, wherein like reference characters designate like or corresponding parts throughout several views, a preferred embodiment of the present invention is described below.

FIG. 1 is a schematic block diagram showing a hardware construction of an automatic cell placement and wire routing between cells apparatus according to one embodiment of the present invention.

This apparatus includes a computer 1, and an input device 2, a display device 3, and an external storage device that are coupled to the computer 1. A net-list 4 and a cell library 5 have been stored in this external storage device.

the computer 1 performs, according to a program installed therein, an automatic placement for cells with using data of the net-list 4 and the cell library 5, and stores its cell layout data 6 in the external storage device; and (1) performs an error check, described later, in connection with wiring as a preparation before the automatic routing, and modifies the cell placement on the basis of the result of error check; and then (2) performs the above-described processes of FIG. 9 except step S2 and then the processes of FIG. 10. That is, inter-cell wiring is performed using the net-list 4 and the cell layout data 6, and its wiring layout data 7 is stored in the external storage device. Next, an error check on the laid-out wiring is performed to correct the layout of cells and wiring, consequently resolving the error.

Figure 2:
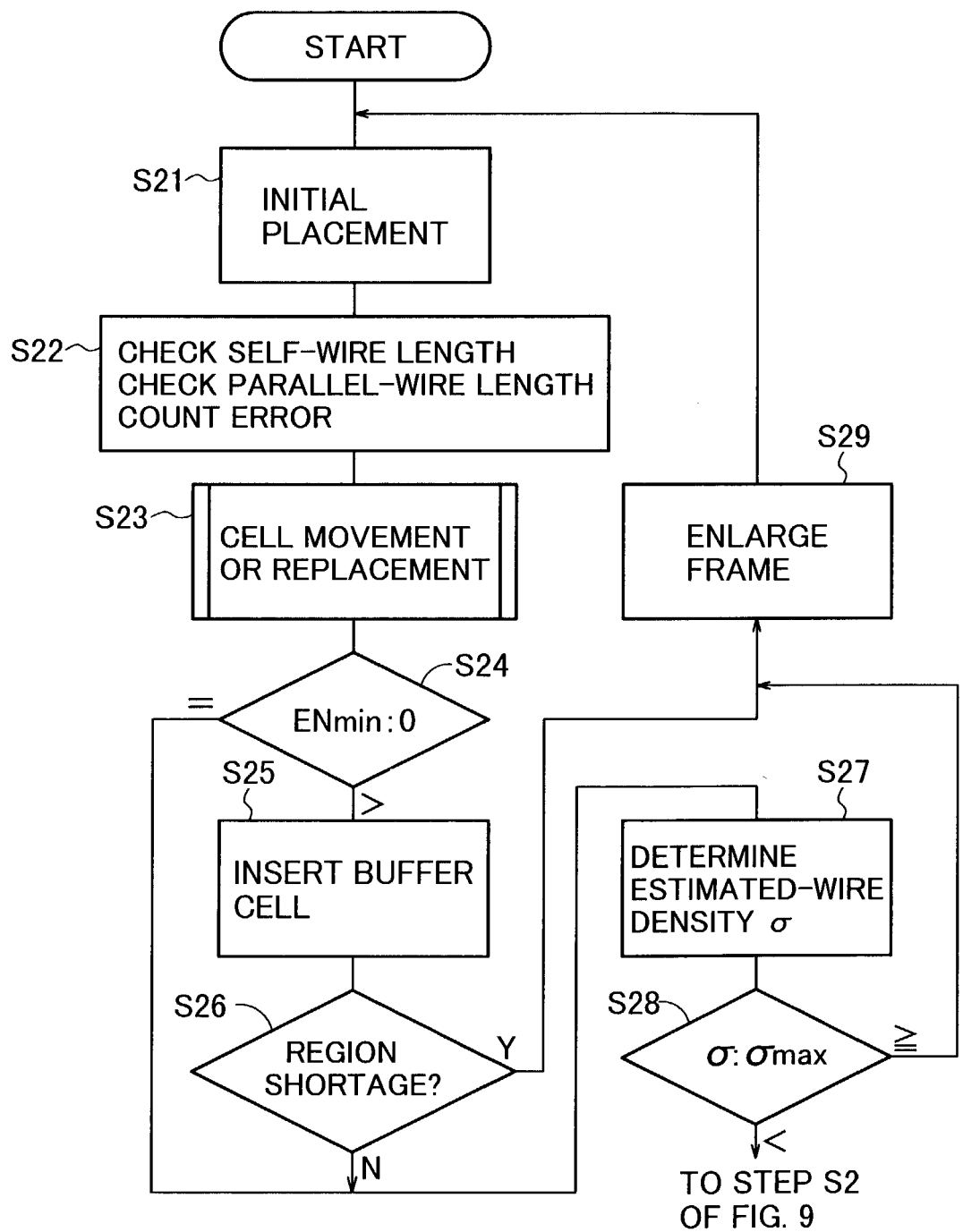
FIG. 2 is a flowchart showing in detail a process performed before routing and after placement of cells by the computer 1 of FIG. 1.

FIG. 2 shows in detail the above-mentioned process (1) performed by the computer 1.

(S21) An initial placement of cells is performed on the basis of the data of the net-list 4 and the cell library 5. This process is the same as step S1 of FIG. 9. The present embodiment has a characteristic in that the processes of the following steps S22 to S30 are performed between this automatic placement and the automatic routing of step S2 of FIG. 9.

Figure 3:
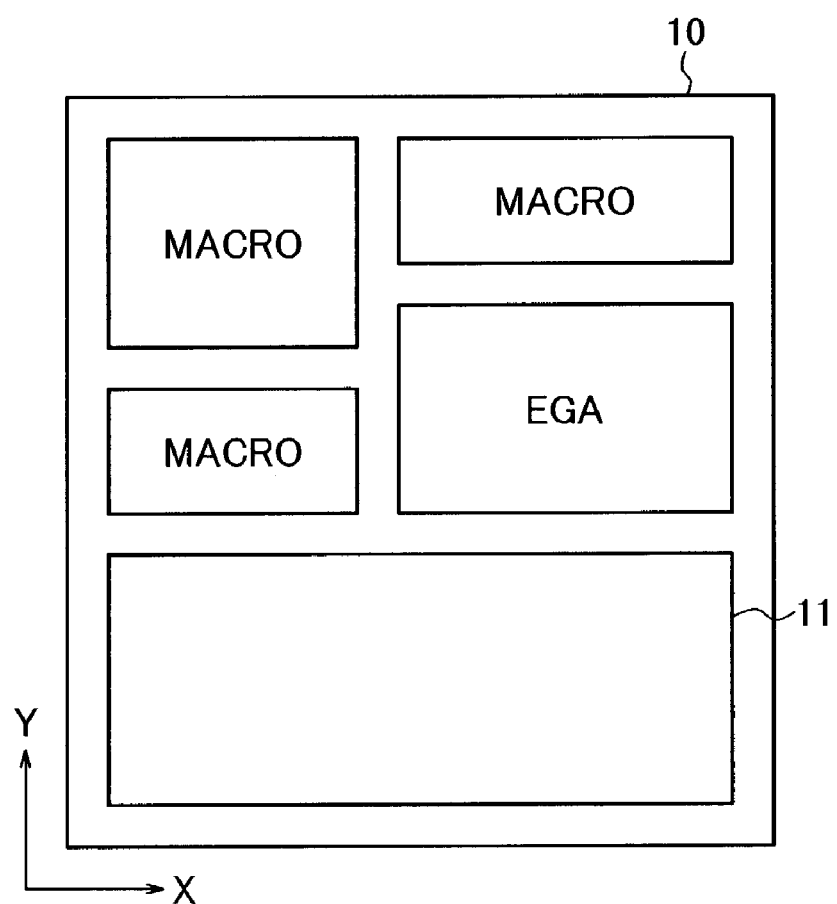
FIG. 3 is a layout sketch showing a chip frame including a design-target frame.

The circuit to be layout-designed according to the present embodiment is placed, for example, within a frame 11 in a chip frame 10 of FIG. 3.

(S22) As the wire length is longer, the signal waveform is duller, and the timing is deviated to tend to be a wrong signal. For this reason, if a wire length (a self-wire length) is more than a predetermined value, 1 mm for example, it is assumed that error occurs.

Figure 4:
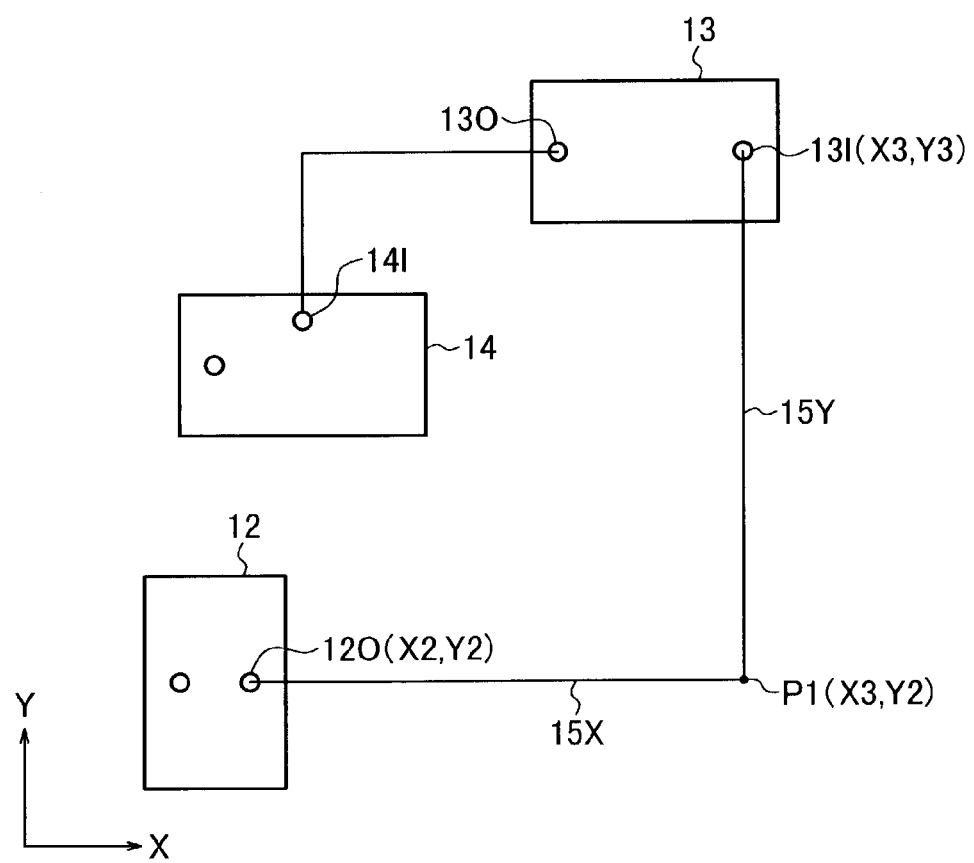
FIG. 4 is an illustration of a self-wire length error.

Since the layout of wiring has not yet been performed, the check is performed for the Manhattan length as the self-wire length. As shown in FIG. 4 for example, when it is found from the net-list 4 that the output terminal 12O of a cell 12 and an input terminal 13I of a cell 13 share the same node, the position coordinate (X2, Y2) of the output terminal 12O and the position coordinate (X3, Y3) of the input terminal 13I are read referring to the cell layout data 6. Then, obtained is the position coordinate P1 (X3,Y2) of the cross point between a straight line parallel to X-axis passing through the output terminal 12O and a straight line parallel to Y-axis passing through the input terminal 13I. Now, calculated is a Manhattan length that is the sum of the length of an estimated wire 15X connected between the output terminal 12O and the point P1, and the length of an estimated wire 15Y connected between the input terminal 13I and the point P1. A judgment is made as to whether the calculated Manhattan length is more than 1 mm, and if it is more than 1 mm, a set of ID codes of the terminals 12O and 13I is stored as a self-wire length error spot. The same is also performed between the output terminal 13O of the cell 13 and an input terminal 14I of the cell 14. Such check is also performed for each node in the net-list 4.

In addition, as the parallel-wire length is larger, the crosstalk may cause deformation of the signal waveform, and it may cause a signal propagation delay. For this reason, when the parallel-wire length is more than a predetermined value, 0.5 mm for example, it is assumed that error occurs.

Figure 6:
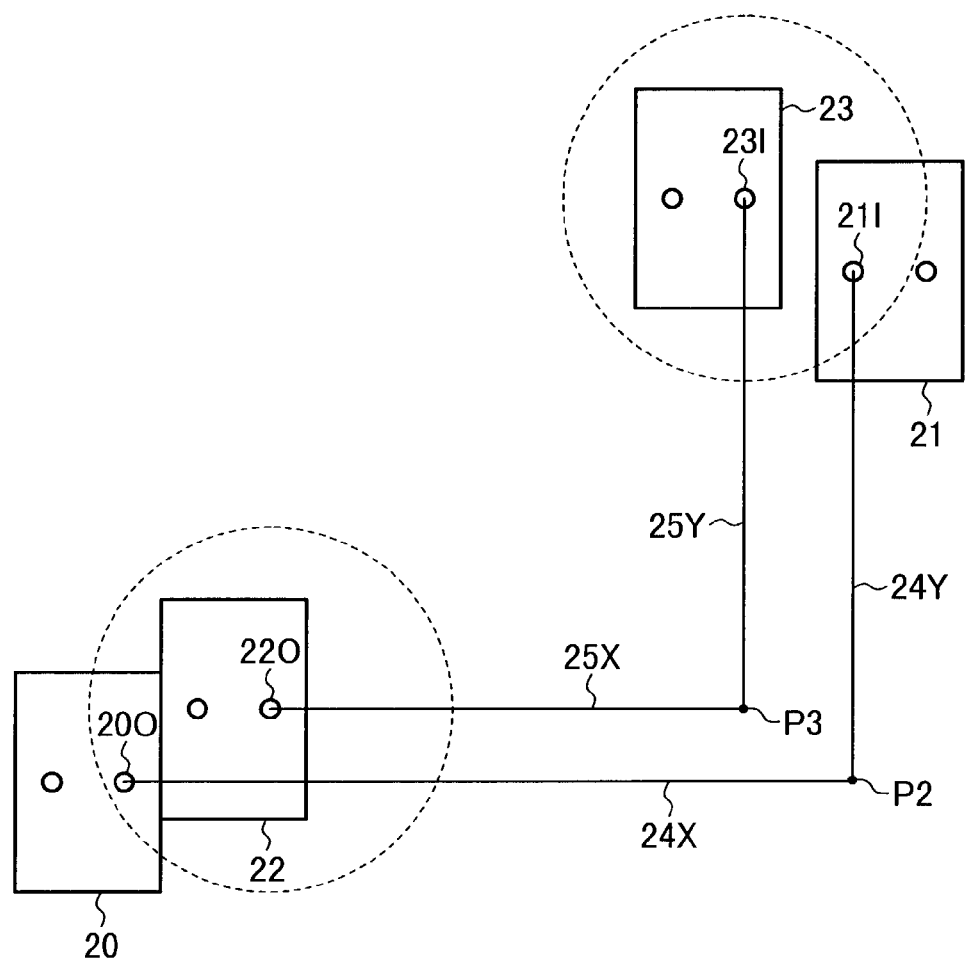
FIG. 6 is an illustration of a parallel-wire length error.

In this case as well, the layout of wiring has not yet been performed, and therefore a check of the parallel-wire length is performed using the Manhattan length. As shown in FIG. 6 for example, when the output terminal 20O of a cell 20 and an input terminal 21I of a cell 21 share the same node, the output terminal 22O of a cell 22 and an input terminal 23I of a cell 23 share the same node, and each of the intervals between the output terminals 20O and 22O and between the input terminals 20I and 23I is less than a predetermined value, these parallel-wires is subjected to check. As the same as in the case of FIG. 4, obtained is a Manhattan length that is the sum of the lengths of estimated wires 24X and 24Y between the output terminal 20O and the input terminal 21I. Because of a rough estimation of error, this Manhattan length is assumed as the parallel-wire length, and if it is more than 0.5 mm, a set of the ID codes of the terminals 20O and 21I and a set of the ID codes of the terminals 22O and 23I are stored as a parallel-wire length error. Instead of this Manhattan length, it is allowed to obtain as the parallel-wire length another Manhattan length that is the sum of the lengths of the estimated wires 25X and 25Y between the output terminal 22O and the input terminal 23I. In addition, the sum of the smaller one in length of the estimated wires 24X and 25X and the smaller one in length of the estimated wires 24Y and 25Y may be used as the parallel-wire length.

The total number ENO of self-wire length error and parallel-wire length error is obtained.

(S23) When an error is detected in step S22, cells are moved for resolving this error. That is, the cell layout data 6 is modified. Because the layout of wiring has not been performed, this movement is relatively easy.

Figure 5A:
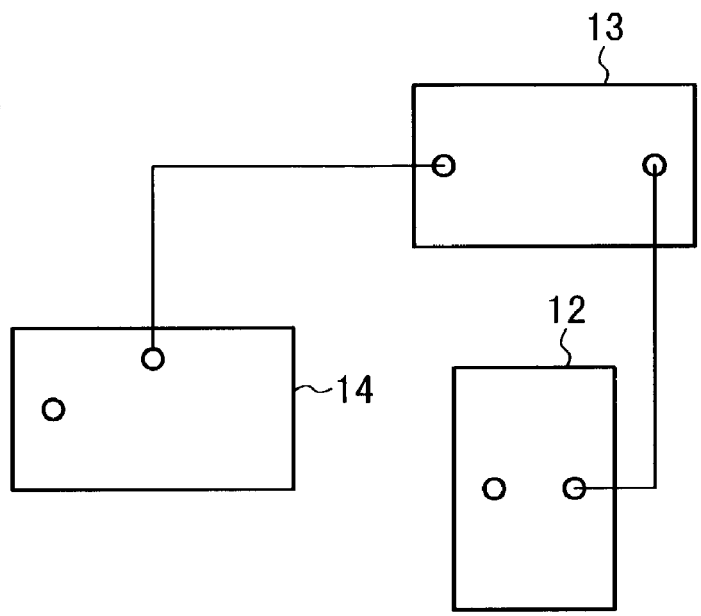
FIGS. 5(A) and 5(B) are illustrations of cell movement and insertion of buffer cells for resolving the self-wire length error, respectively.

In FIG. 4 for example, when there is a self-wire length error between the cells 12 and 13, the cell 12 is moved to be closer to the cell 13 as shown in FIG. 5(A). In addition, when there is a parallel-wire length error in the case of FIG. 6, the cells 22 and 23 are moved to be apart from the cells 20 and 21, respectively.

When a cell is overlapped with the moved cell, the overlapped cell is also moved. When the number of moved cells caused by the overlapping exceeds a predetermined number, all cells are replaced by the same program as that of step S21 except for such restrictions that when there is a self-wire length error, cells connected by the wiring is placed closer to each other, and, on the other hand, when there is a parallel-wire length error, the distances, in FIG. 6 for example, between the cells 20 and 22 and between the cells 21 and 23 exceeds a predetermined value.

The process of step S23 may be performed only once. However, because it is relatively easy to perform it due to a preparation before wiring, and a new self-wiring or parallel-wire length error is likely to occur due to the movement or replacement of cells, the process of step S23 may be performed a plurality of times. That is, the movement or replacement of cells is performed a plurality of times; self-wiring and parallel-wire length checks are performed; and the smallest one in the number of errors is selected from the checked ones as an optimum solution of the movement or replacement of cells.

Figure 7:
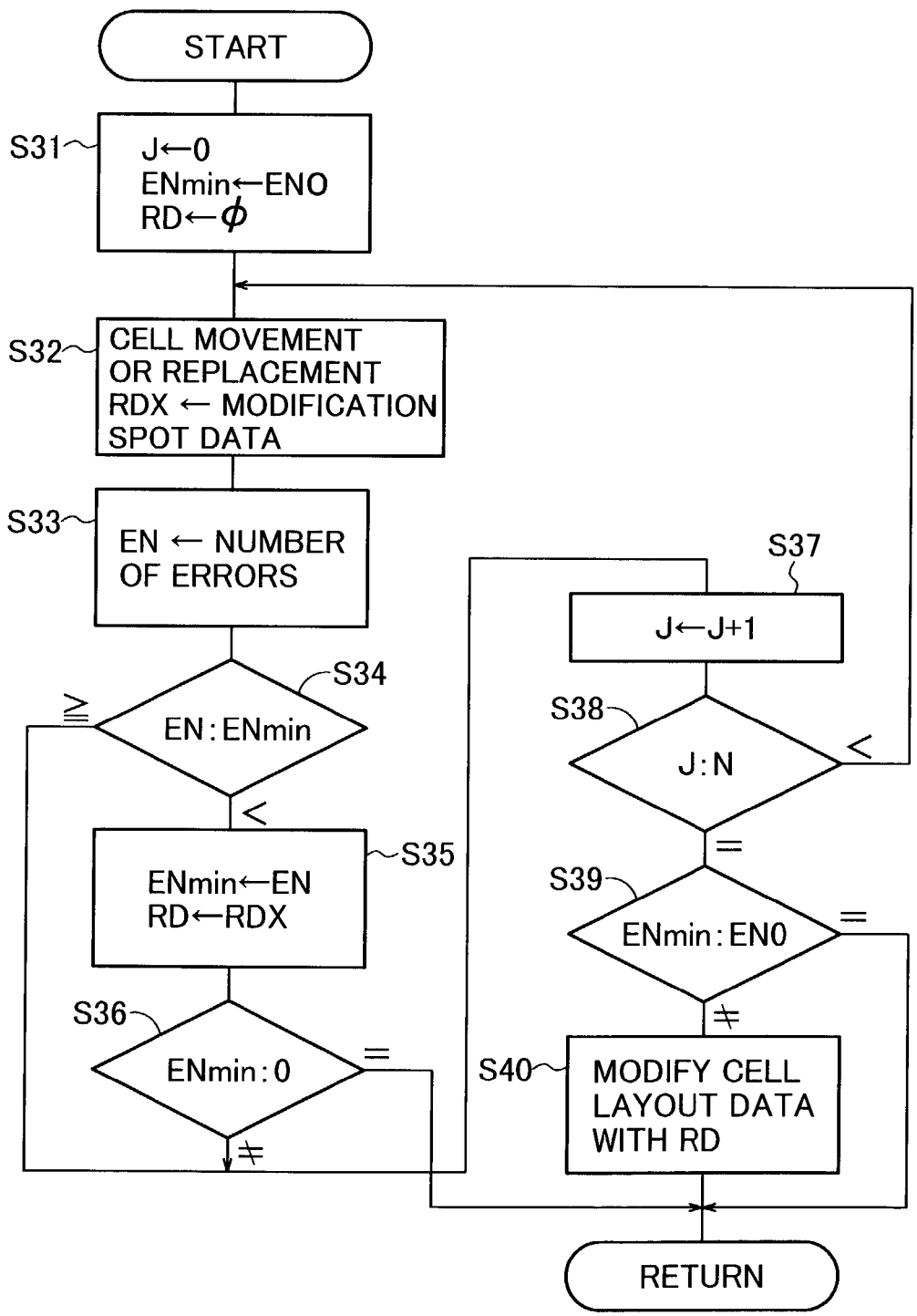
FIG. 7 is a flowchart showing in detail the step S23 of FIG. 2.

FIG. 7 is a flowchart showing in detail the step S23 in the latter case, which will be described below in detail.

(S31) An initial value 0 is substituted for a repeat variable J. In addition, the number of errors EN0 detected in step S22 is substituted as an initial value for the minimum number-of-errors variable ENmin. An empty set $\phi$ is substituted for an optimum solution RD of cell placement modification spot data.

(S32) The above-mentioned movement or replacement of cells is performed, and stored is a cell placement modification spot data RDX for the cell layout data 6.

(S33) The same process as step S22 of FIG. 2 is performed to obtain the total number of errors, which is substituted for the variable EN.

(S34) If EN<ENmin, then the process goes to step S35, or else, goes to step S37.

(S35) ENmin is updated by substituting EN for it, and the optimum solution RD of the cell placement modification spot data is updated by replacing it with the data RDX of step S32.

(S36) If ENmin=0, then the process goes to step S24 of FIG. 2, or else, goes to step S37.

(S37) The value of J is incremented by 1.

(S38) If J<N, then the process returns to step S32, or else, goes to step S39, where N is a constant. Note that instead of using the repeat number of times N, it is also allowed that the process goes to step S39 when the processing time exceeds a predetermined value.

(S39) If ENmin≠EN0, then the process goes to step S40, or else, goes to step S24 of FIG. 2.

(S40) The cell layout data 6 is modified with the optimum solution RD of cell placement modification spot data. Next, the process goes to step S24 of FIG. 2.

(S24) If ENmin>0, then the process goes to step S25, or else, the process goes to step S27.

Figure 5B:
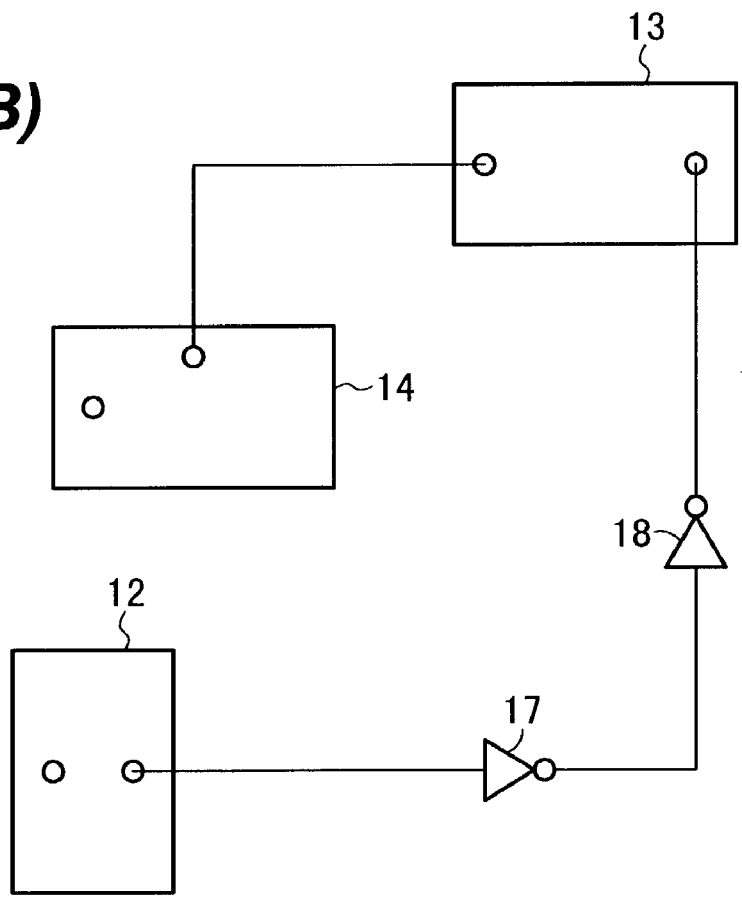

(S25) Buffer cells are inserted in wires where self-wiring or parallel-wire length errors are detected. For example, in FIG. 4, when there is a self-wire length error between the output terminal 12O and the input terminal 13I, inverters 17 and 18 are inserted therebetween as shown in FIG. 5(B). That is, the net-list 4 and the cell layout data 6 are modified in response to this insertion. Similarly, a buffer cell is also inserted in each wire of parallel-wire length error as shown in FIG. 6.

The movement of cells may cause a new error. However, because the insertion of the buffer cell allows reduction in the number of errors with almost no occurrence of a new error, the number of errors can be reduced efficiently without excessive insertion of buffer cells by firstly performing the process of step S23 and then performing the process of step S25.

(S26) If there is not a sufficient region for insertion of buffer cells in step S25, then the process goes to step S29, or else, goes to step S27.

According to the present embodiment, the above-mentioned preparation is performed to estimate and cope with the occurrence of post-wiring errors in advance before performing the inter-cell wiring. This allows reduction in the number of error occurrences, compared to the prior art, and also allows reduction in the repeat number of processes for spacing between lines in parallel, or decrease in insertions of buffer cells, in the complicated state after the inter-cell wiring. This consequently reduce the entire process time of placement and routing in comparison with the prior art.

This preparation also makes it possible to reduce the useless regions in comparison with the prior art, by decreasing the area of the frame 11 as a design target that secures a margin for the spacing or the insertion of buffer cells after the wiring.

In addition, in order to ensure these advantages more firmly, the following processes are performed.

(S27) Calculated is a wire density of estimated wiring.

Figure 8:
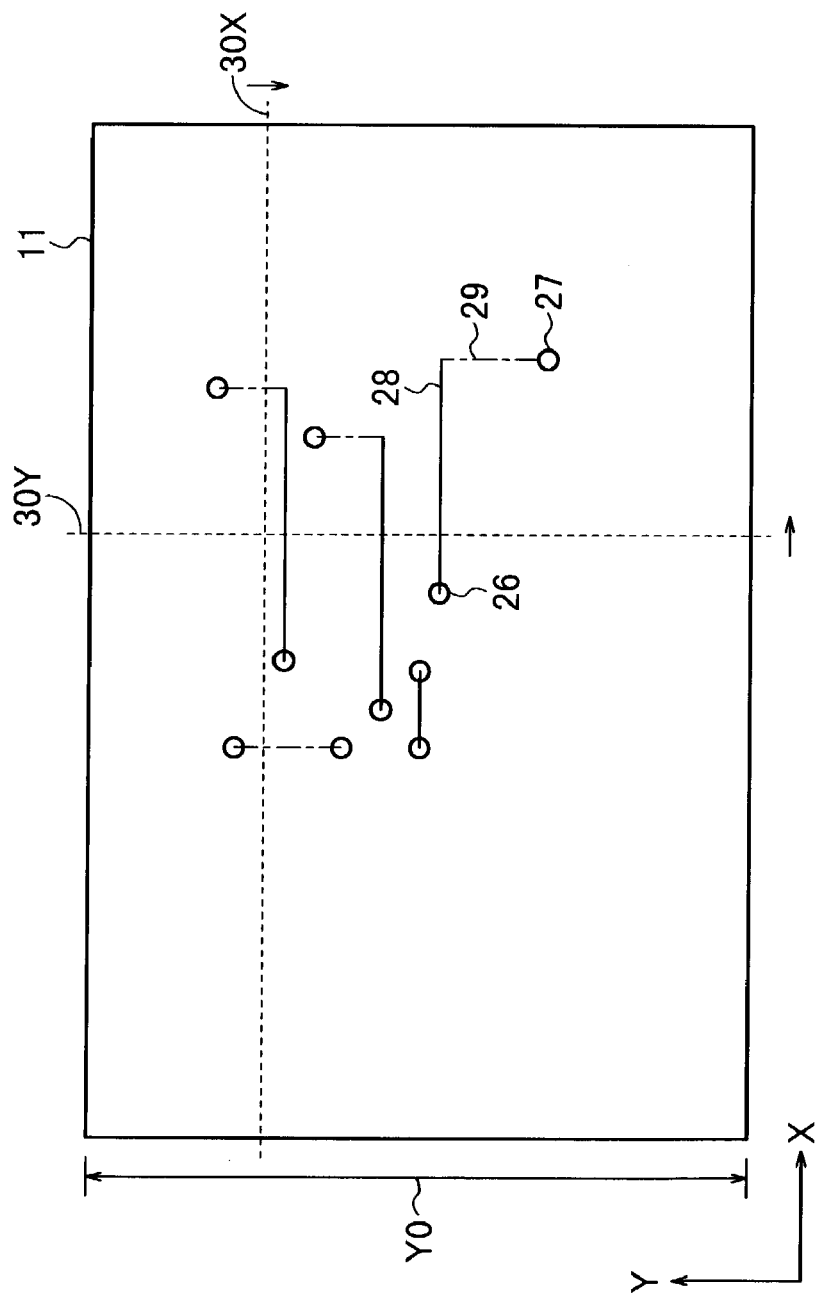
FIG. 8 is an illustration of calculation for the wire density of estimated wiring of the step S27 of FIG. 2.

As shown in FIG. 8 for example, estimated wires having Manhattan-length path are formed between cell terminals sharing the same node. For example, a connection between terminals 26 and 27 is made with an estimated wire 28 parallel to X-axis and an estimated wire 29 parallel to Y-axis. The wires parallel to X-axis are disposed on a different layer from the wires parallel to Y-axis.

(a) Obtained is the number of cross points between a line 30Y parallel to Y-axis and portions of estimated wires which are parallel to X-axis as shown in solid lines;

(b) the line 30Y is shifted by a predetermined pitch in the direction of X-axis; and the maximum value CPYmax of the number of cross points is determined by repeating the processes (a) and (b).

Letting the Y-direction length of the design-target frame 11 be "Y0", and the minimum allowable value of inter-wiring interval be "d", the estimated-wire density σy is defined by the following equation:

$$\sigma y = CPY\max/(Y0/d)$$

In the same way, σx is determined by assuming a line 30X for portions of estimated wires parallel to Y-axis as shown in dashed line. The larger one of the estimated-wire densities σx and σy is assumed as an estimated-wire density σ.

Figure 9:
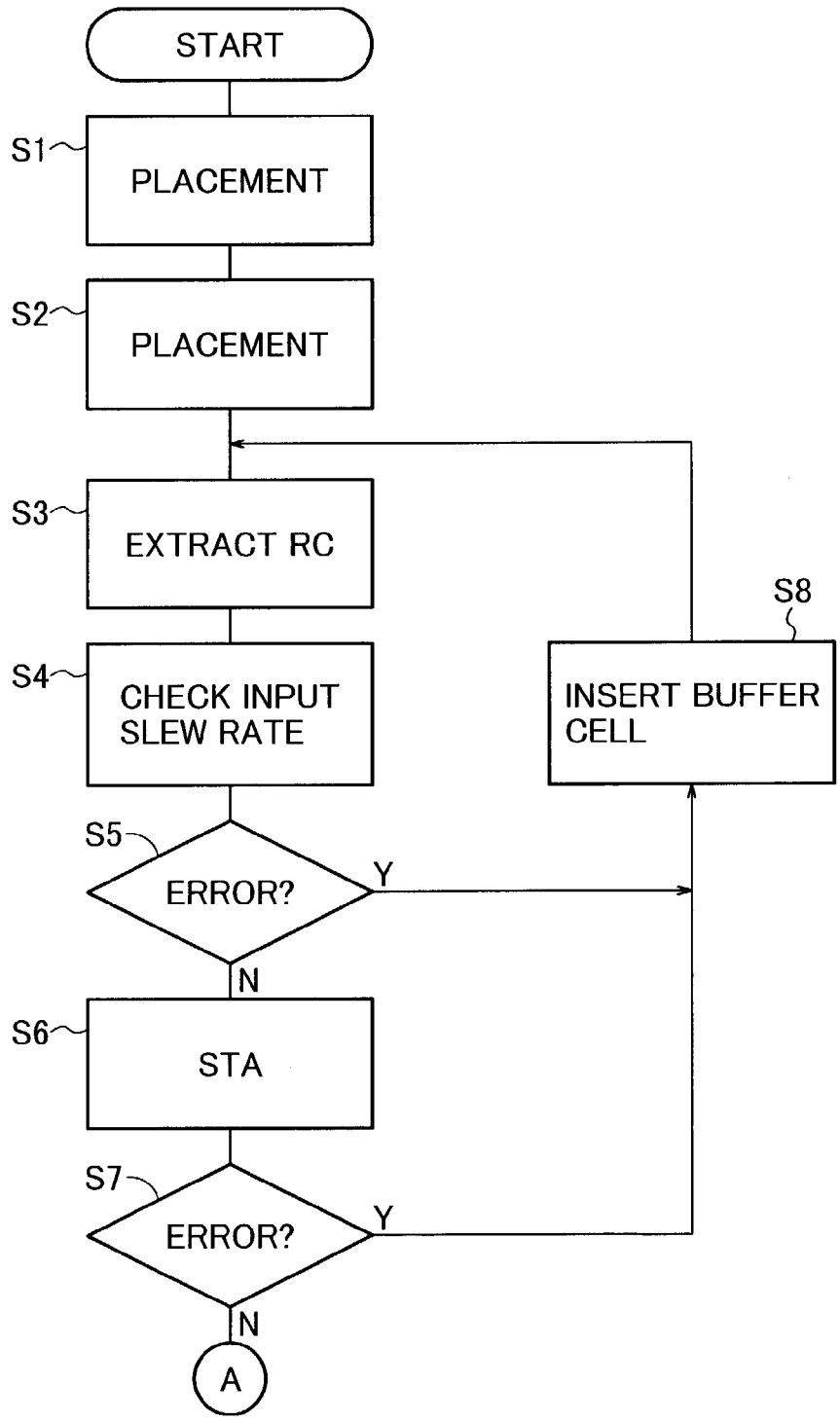
FIG. 9 is a flowchart showing part of a prior art process for an automatic cell placement and wire routing between cells.
Figure 10:
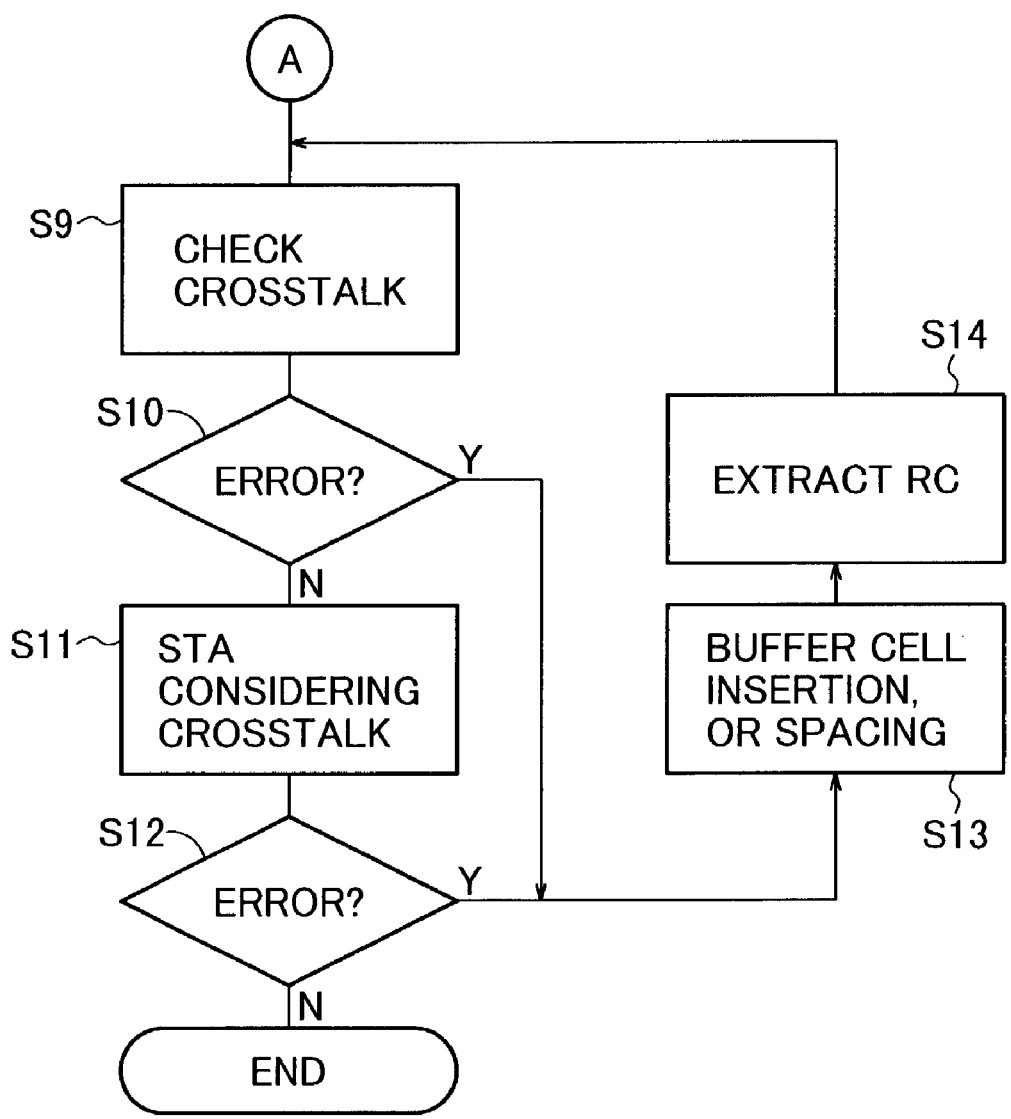
FIG. 10 is a flowchart showing the continuation of FIG. 9.

(S28) If σ<σmax, then the process goes to step S2 of FIG. 9, or else, goes to step S29, where σmax is an empirically determined value.

(S29) X and Y-direction lengths of the design-target frame 1 are increased according to the values of estimated-wire densities σx and σy, respectively, and the process returns to step S21. This allows performing again the above-mentioned processes, securing a preparatory region suitable for coping with errors to be introduced in the processes of FIGS. 9 and 10.

Although a preferred embodiment of the present invention has been described, it is to be understood that the invention is not limited thereto and that various changes and modifications may be made without departing from the spirit and scope of the invention.

What is claimed is:

1. A method of an automatic cell placement and wire routing between cells, wherein cell placement data has been obtained by performing an automatic cell placement, and before an automatic wire routing between cells, the method comprising:
   (a) connecting estimated wires of Manhattan-length path between same node terminals of cells, and detecting a crosstalk error that occurs when a parallel-wire length is more than a predetermined value, after an automatic cell placement and before an automatic wire routing between cells; and
   (b) resolving a detected crosstalk error by moving at least one cell that is closely spaced less than a predetermined interval from another cell and connected to the estimated wires where the crosstalk error is detected, after an automatic cell placement and before an automatic wire routing between cells.

2. The method according to claim 1, wherein in (a), the detected crosstalk error is counted; in (b), cell movement data is stored in a storage device; and (a) and (b) are repeated a plurality of times, the method further comprising:

(c) modifying the cell placement data on the basis of the cell movement data of (b) belonging to (a) and (b) corresponding to a minimum value of error counts of all repeated times.

3. The method according to claim 2, further comprising:
   (d) modifying a net list and the cell placement data so as to insert a buffer cell in the error-detected estimated wire when the minimum value is not equal to zero.

4. The method according to claim 3, further comprising:
   (e) determining a wire density of the estimated wires of Manhattan-length path between cells, and if the wire density is more than a predetermined value, enlarging a design-target frame, and returning to the automatic cell placement process.

5. The method according to claim 1, before (a), further comprising:
   (f) detecting that a first interval between first and second terminals and a second interval between third and fourth terminals each are less than a predetermined interval, the first to fourth terminals belonging to first to fourth cells, respectively, the first and third terminals belonging to a first node, the second and fourth terminals belonging to a second node,
   wherein (a) is performed for the detected first to fourth cells in (f).

6. A method of an automatic cell placement and wire routing between cells, wherein cell placement data has been obtained by performing an automatic cell placement, and before an automatic wire routing between cells, the method comprising:
   (a) connecting estimated wires of Manhattan-length path between same node terminals of cells, and detecting a self-wire length error that occurs when a self-wire length is more than a predetermined value, after an automatic cell placement and before an automatic wire routing between cells; and
   (b) resolving a self-wire length error by moving at least one cell that is spaced more than a predetermined value from another cell and connected to the estimated wires where the self-wire length error is detected, after an automatic cell placement and before an automatic wire routing between cells.

7. The method according to claim 6, wherein in (a), the detected self-wire length error is counted; in (b), cell movement data is stored in a storage device; and (a) and (b) are repeated a plurality of times, the method further comprising:
   (c) modifying the cell placement data on the basis of the cell movement data of (b) belonging to (a) and (b) corresponding to a minimum value of error counts of all repeated times.

8. The method according to claim 7, further comprising:
   (d) modifying a net list and the cell placement data so as to insert a buffer cell in the error-detected estimated wire when the minimum value is not equal to zero.

9. The method according to claim 8, further comprising:
   (e) determining a wire density of the estimated wires of Manhattan-length path between cells, and if the wire density is more than a predetermined value, enlarging a design-target frame, and returning to the automatic cell placement process.

10. A computer program product comprising a computer program causing a computer to perform an automatic cell placement and wire routing between cells, wherein after cell placement data has been obtained and before the wire routing, the computer program includes instructions for:
    (a) connecting estimated wires of Manhattan-length path between same node terminals of cells, and detecting a crosstalk error that a parallel-wire length is more than a predetermined value, after an automatic cell placement and before an automatic wire routing between cells; and (b) resolving the crosstalk error by moving at least one of cells, closely spaced less than a predetermined interval from each other and connected to the estimated wires where the crosstalk error is detected, after an automatic cell placement and before an automatic wire routing between cells.

11. The computer program product according to claim 10, wherein in (a), the detected crosstalk error is counted; in (b), cell movement data is stored in a storage device; and (a) and (b) are repeated a plurality of times, and the computer program includes instructions for:

(c) modifying the cell placement data on the basis of the cell movement data of (b) belonging to (a) and (b) corresponding to a minimum value of error-counts of all repeated times.

12. The computer program product according to claim 11, wherein the computer program includes instructions for:

(d) modifying a net list and the cell placement data so as to insert a buffer cell in the error-detected estimated wire when the minimum value is not equal to zero.

13. The computer program product according to claim 12, wherein the computer program includes instructions for:

(e) determining a wire density of the estimated wires of Manhattan-length path between cells, and if the wire density is more than a predetermined value, enlarging a design-target frame, and returning to the automatic cell placement process.

14. A computer program product comprising a computer program causing a computer to perform an automatic cell placement and wire routing between cells, wherein cell placement data has been obtained by performing an automatic cell placement, and before an automatic wire routing between cells, the computer program includes instructions for:

(a) connecting estimated wires of Manhattan-length path between same node terminals of cells, and detecting a self-wire length error that a self-wire length is more than a predetermined value, after an automatic cell placement and before an automatic wire routing between cells; and (b) resolving a self-wire length error by moving at least one of cells, spaced more than a predetermined value from each other and connected to the estimated wires where the self-wire length error is detected, after an automatic cell placement and before an automatic wire routing between cells.

15. The computer program product according to claim 14, wherein in (a), the detected self-wire length error is counted; in (b), cell movement data is stored in a storage device; and (a) and (b) are repeated a plurality of times, and wherein the computer program includes instructions for:

(c) modifying the cell placement data on the basis of the cell movement data of (b) belonging to (a) and (b) corresponding to a minimum value of error counts of all repeated times.

16. The computer program product according to claim 15, wherein the computer program includes instructions for:

(d) modifying a net list and the cell placement data so as to insert a buffer cell in the error-detected estimated wire when the minimum value is not equal to zero.

17. The computer program product according to claim 16, wherein the computer program includes instructions for:

(e) determining a wire density of the estimated wires of Manhattan-length path between cells, and if the wire density is more than a predetermined value, enlarging a design-target frame, and returning to the automatic cell placement process.

18. A method of automatic cell placement and automatic wire routing between cells, comprising:

connecting same-node terminals of cells with estimated Manhattan-length wires to detect a crosstalk error that occurs when a parallel-wire length is greater than a predetermined length, after said automatic cell placement and before said wire routing between cells; and resolving a detected crosstalk error by repositioning at least one cell that is less than a predetermined distance from another cell and connected to the wires where the crosstalk error exists, after said automatic cell placement and before said wire routing between cells.

19. A method of automatic cell placement and automatic wire routing between cells, comprising:

connecting same-node terminals of cells with estimated Manhattan-length wires to detect a self-wire length error that occurs when a self-wire length is greater than a predetermined length, after said automatic cell placement and before said wire routing between cells; and resolving a detected self-wire length error by repositioning at least one cell that is more than a predetermined distance from another cell and connected to the wires where the self-wire length error exists, after said automatic cell placement and before said wire routing between cells.

* * * * *